(12) United States Patent
Kuo et al.

(10) Patent No.: US 12,185,490 B2
(45) Date of Patent: Dec. 31, 2024

(54) SUPPORTING ASSEMBLIES FOR INSTALLABLE COMPONENTS

(71) Applicant: Hewlett-Packard Development Company, L.P., Spring, TX (US)

(72) Inventors: Chun-Wei Kuo, Taipei (TW); Chien-Hao Chen, Taipei (TW); Bang-Zhong Xu, Shanghai (CN); Justin Tinhsi Lee, Taipei (TW)

(73) Assignee: Hewlett-Packard Development Company, L.P., Spring, TX (US)

( * ) Notice: Subject to any disclaimer, the term of this patent is extended or adjusted under 35 U.S.C. 154(b) by 183 days.

(21) Appl. No.: 18/007,350

(22) PCT Filed: Jul. 31, 2020

(86) PCT No.: PCT/US2020/044364
§ 371 (c)(1),
(2) Date: Jan. 30, 2023

(87) PCT Pub. No.: WO2022/025906
PCT Pub. Date: Feb. 3, 2022

(65) Prior Publication Data
US 2023/0282997 A1    Sep. 7, 2023

(51) Int. Cl.
*G06F 1/18*    (2006.01)
*H05K 7/14*    (2006.01)

(52) U.S. Cl.
CPC .......... *H05K 7/1409* (2013.01); *G06F 1/185* (2013.01)

(58) Field of Classification Search
CPC ....... G06F 1/185; G06F 1/186; H05K 7/1409; H05K 7/1429
See application file for complete search history.

(56) References Cited

U.S. PATENT DOCUMENTS

| | | | |
|---|---|---|---|
| 5,892,660 A | 4/1999 | Farnworth et al. | |
| 6,981,886 B1 | 1/2006 | Co et al. | |
| 7,684,196 B2 * | 3/2010 | Eckberg | H01L 23/3672 174/16.3 |
| 8,199,511 B2 | 6/2012 | Kim et al. | |
| 8,254,123 B2 * | 8/2012 | Sun | H05K 7/20727 439/153 |
| 8,684,757 B2 * | 4/2014 | Bridges | H01R 12/7029 439/196 |
| 8,858,257 B2 * | 10/2014 | Mo | H01R 13/62977 439/578 |
| 8,926,348 B2 * | 1/2015 | Ma | H01R 12/72 439/160 |

(Continued)

FOREIGN PATENT DOCUMENTS

| | | |
|---|---|---|
| CN | 201017265 Y | 2/2008 |
| RU | 2595252 C2 | 8/2016 |

(Continued)

*Primary Examiner* — Sagar Shrestha
(74) *Attorney, Agent, or Firm* — Quarles & Brady LLP

(57) ABSTRACT

Examples of a supporting assembly for supporting an installable component are described. The supporting assembly comprises a supporting member. The supporting assembly may further include a latch bar extending longitudinally to support the installable component. The supporting assembly may further include a coupling arm and a control knob. In an example, the control knob may be rotatable, and is to control rotation of the latch bar.

15 Claims, 10 Drawing Sheets

(56) References Cited

U.S. PATENT DOCUMENTS

| | | |
|---|---|---|
| 10,001,819 B2 | 6/2018 | Heyd et al. |
| 10,080,300 B1* | 9/2018 | Olesiewicz et al. |
| 11,081,827 B2* | 8/2021 | Eng-Kan ............ H01R 13/6273 |
| 2008/0176432 A1 | 7/2008 | Scherer et al. |
| 2009/0017665 A1* | 1/2009 | Gao ..................... H01R 13/627 |
| | | 439/326 |
| 2009/0154123 A1 | 6/2009 | Junkins et al. |
| 2014/0273647 A1 | 9/2014 | Ma |
| 2020/0004302 A1 | 1/2020 | Heyd et al. |

FOREIGN PATENT DOCUMENTS

| | | |
|---|---|---|
| TW | M377623 U | 4/2010 |
| WO | 2016/171726 A1 | 10/2016 |

* cited by examiner

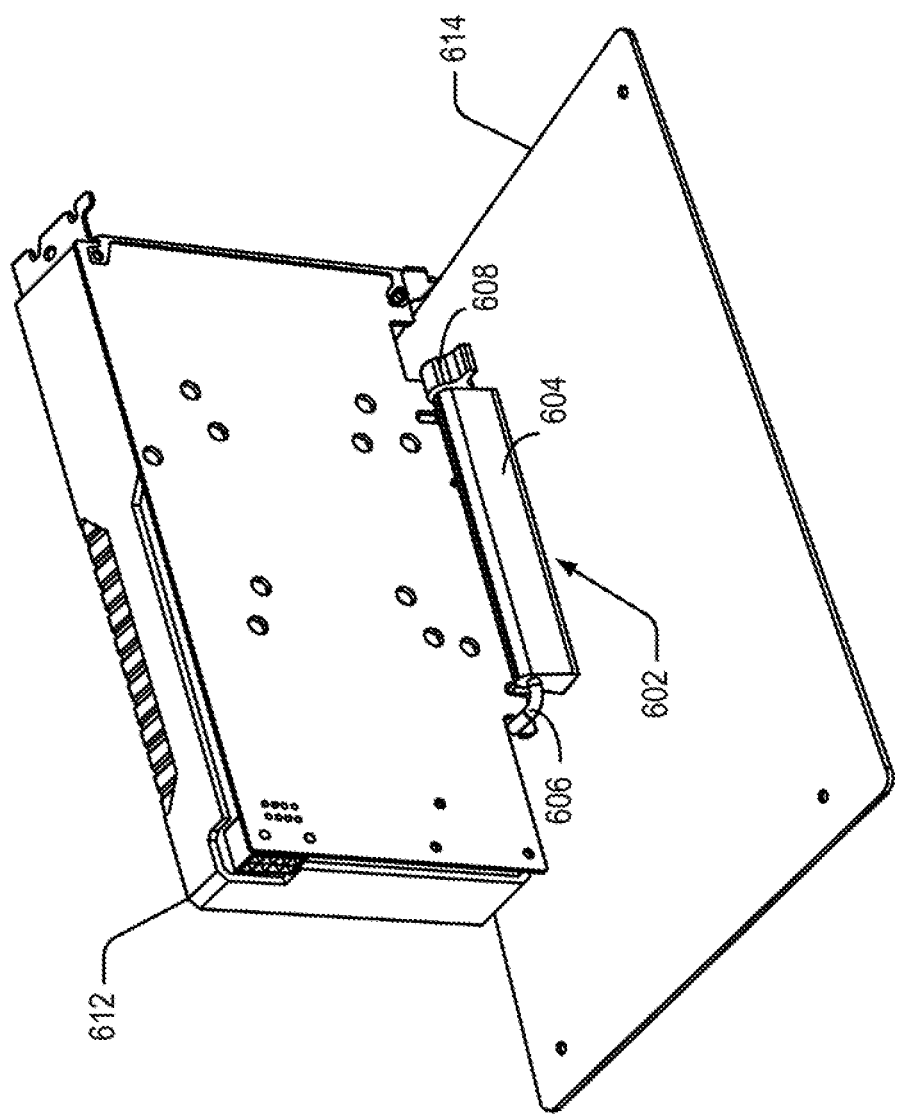

SUPPORTING ASSEMBLIES FOR INSTALLABLE COMPONENTS

BACKGROUND

In computing devices, a motherboard may include an expansion slot for installation of an installable component, such as a graphics card. The installable component may supplement the functional capabilities of the computing device. For installation, the installable component may be inserted into the expansion slot. The expansion slot may further include mechanisms which may rigidly secure the installable component, when inserted into the expansion slot. If the installable component is to be removed, the mechanisms may be disengaged, and the installable component may be pulled out of the expansion slot.

BRIEF DESCRIPTION OF THE DRAWINGS

The following detailed description references the drawings, wherein:

FIGS. 10-11 illustrate a supporting assembly through various stages of removing the installable component, in accordance with an example of the present subject matter.

DETAILED DESCRIPTION

Figure 1:
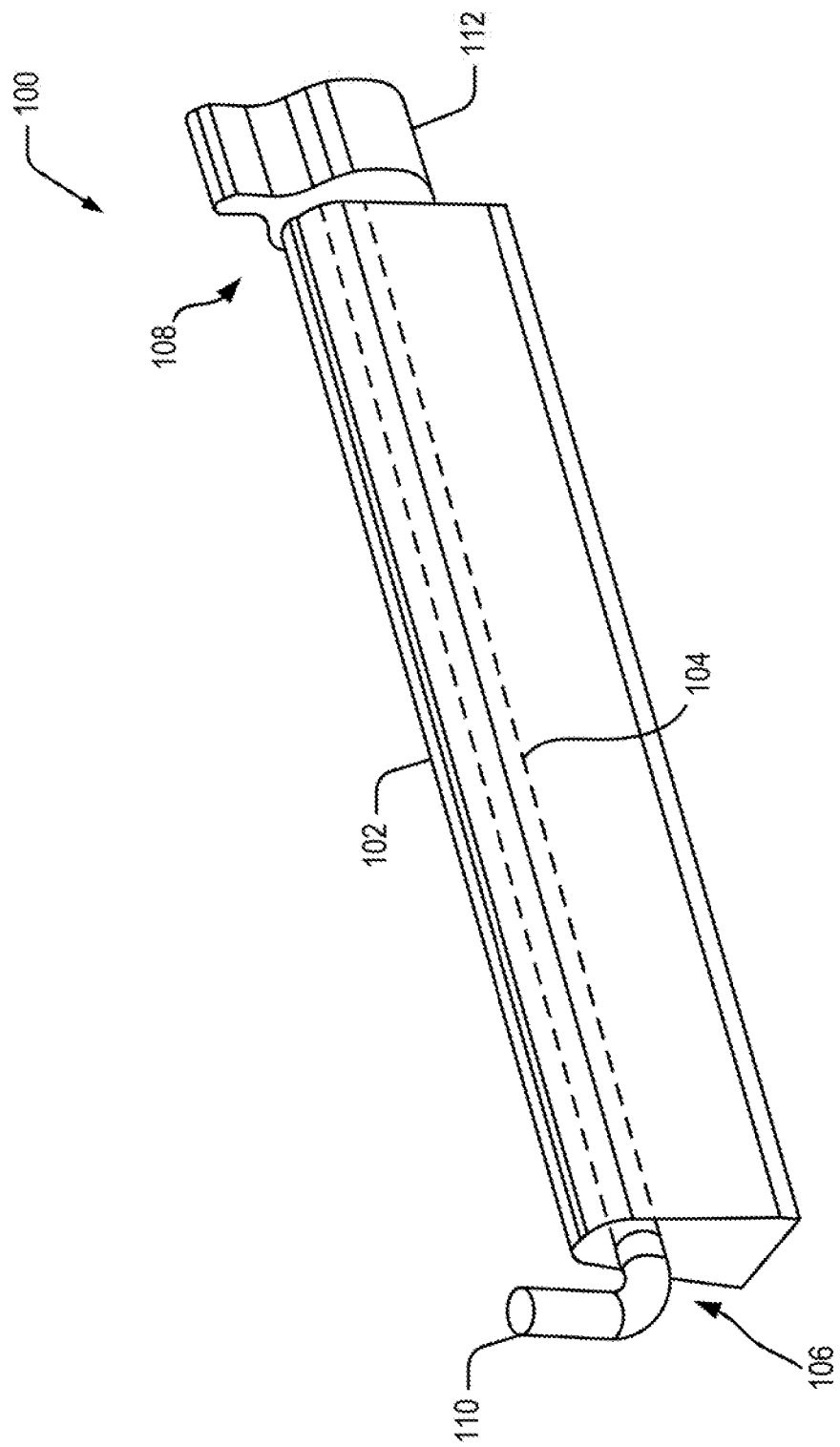
FIG. 1 illustrates a front perspective view of a supporting assembly, in accordance with an example of the present subject matter.

Computing devices, such as personal computers, server stations, and workstations, may include an electronic circuit board, also referred to as a system board or motherboard, on which various components and circuitry may be implemented. The electronic circuit board may further include an expansion slot into which an installable component may be inserted to provide additional functionalities to the computing device. The installable component may be an expansion card in some examples. Other examples of installable components include, but are not limited to, graphic cards, fiber channel adaptor cards, video processing cards, and storage cards.

The expansion slot (interchangeably referred to as a slot) into which the installable component is inserted, may be further provided with a locking latch. The locking latch is to engage and secure the installable component when it is inserted into the slot, and may prevent any movement of the installable component during the use of the computing device. In case the installable component is to be removed or replaced, a user may disengage the locking latch which may allow the user to withdraw the installable component from the slot. Examples of such slots include, but are not limited to, Peripheral Component Interconnect (PCI) slot, Peripheral Component Interconnect Express (PCIe) slot, and an Accelerated Graphics Port (AGP) slot or other slots that are integrated on the motherboard.

The locking latch may be provided at one end of the slot, and is to manually disengage before the installable component may be withdrawn. In certain cases, the installable component (which is installed in the expansion slot) may obscure the locking latch from the user's view and reach, making it difficult for the user to manually access the locking latch. This may be further challenging if another installable component is already installed in another slot. As may also be understood, the size and weight of the installable components, such as graphic cards, has been steadily increasing. The existing locking latch mechanisms may not be structurally capable of supporting such large installable components.

Examples of a supporting assembly for supporting an installable component (e.g., an expansion card) within an electronic device, are described. The supporting assembly may allow insertion and extraction of the installable component from the slots or connectors provided within the electronic circuit board (e.g., a motherboard) of the electronic device. The supporting assembly may be positioned adjacent to the slot into which the installable component is to be installed. In one example, the supporting assembly comprises a latch bar supported by a supporting member. The latch bar extends longitudinally, and is parallel to the slot, into which the installable component is to be inserted. In one example, the latch bar is rotatable about a longitudinally extending rotational axis along the length of the latch bar.

The longitudinally extending latch bar includes a first end and a second end. The first end of the latch bar is provided with a coupling arm. In an example, the coupling arm is moveable, and is to engage with a portion of the installable component as the installable component is inserted into the slot. As a result, the coupling arm may move as the installable component is either being inserted into, or being extracted from the slot. In an example, the coupling arm is to move with respect to a base on which the supporting member may be installed.

The second end of the latch bar may be couplable to a rotatable control knob. The control knob is to control the rotation of the latch bar, and therefore, is to also control the movement of the coupling arm. In an example, the control knob, when in a first position, permits rotation of the latch bar. When the latch bar is free to rotate, the installable component may be inserted or withdrawn from the expansion slot. In a similar manner, when in the second position, the control knob secures the latch bar, to prevent the latch bar and the coupling arm from rotating.

The supporting member of the supporting assembly may be rigidly positioned adjacent to the slot into which the installable component is to be installed. In an example, the supporting assembly may be retrofitted on the electronic circuit board (such as a motherboard). The latch bar may be a solid bar extending longitudinally, and may be manufactured from metallic materials. It may be noted that since the control knob is not obstructed by the installable component, the insertion and extraction of the installable component may be accomplished with ease. In an example, the coupling arm may extend radially from the rotational axis of the latch bar. In such a case, the coupling arm may extend radially from the latch bar at a certain angle. In an example, the coupling arm may be orthogonal to the latch bar. These and other examples are provided in further detail in conjunction with FIGS. 1-11.

FIG. 1 depicts a front perspective view of an example supporting assembly 100. The supporting assembly 100 is to support an installable component (not shown in FIG. 1) of a computing device. The supporting assembly 100 includes a supporting member 102, and a latch bar 104 which is supported by the supporting member 102. In an example, the supporting member 102 and the latch bar 104 may be positioned adjacent, and parallel to, an expansion slot provided on a motherboard of the computing device. In an example, the supporting member 102 is arranged in a manner such that it encloses a portion of the latch 104. The longitudinally extending latch bar 104 further includes a first end 106 and a second end 108. The first end 106 of the latch bar 104 is provided with a coupling arm 110, with the second end 108 being couplable with a control knob 112. The control knob 112 is rotatable between a first position and a second position. When the control knob 112 is in the first position, the latch bar 104 is free to rotate about its longitudinal axis. When in the second position, the control knob 212 is to engage with the latch bar 104 and prevent any rotation of the latch bar 104.

In an example, the coupling arm 110, when the installable component is being installed, engages with a portion of the installable component. In such a case, as the installable component is inserted and is pushed towards the slot, the coupling arm 110 may move downwards, towards the base of the supporting member 102. At this stage, the control knob 112 may be moved from a first position to a second position to secure the latch bar 104 from further rotating. In order to extract the inserted installable component, the control knob 112 may be manually rotated in an opposite direction, i.e., back to the first position, to disengage the latch bar 104. At this stage, the installable component may be manually extracted and retrieved from the slot. These and other examples are explained in further detail in conjunction with the other figures.

Figure 2:
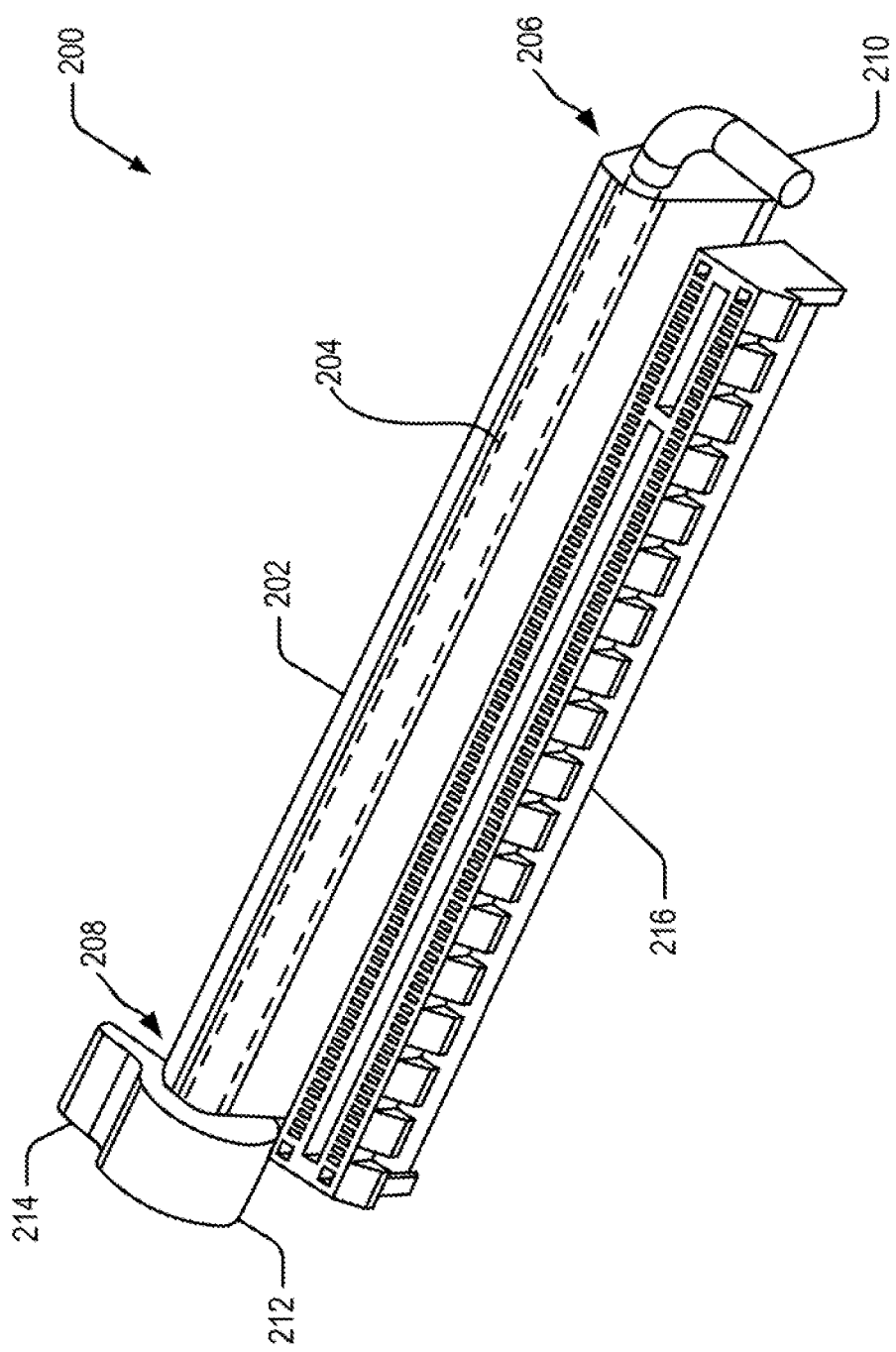
FIGS. 2-3 illustrate different views of a supporting assembly, in accordance with an example of the present subject matter.
Figure 3:
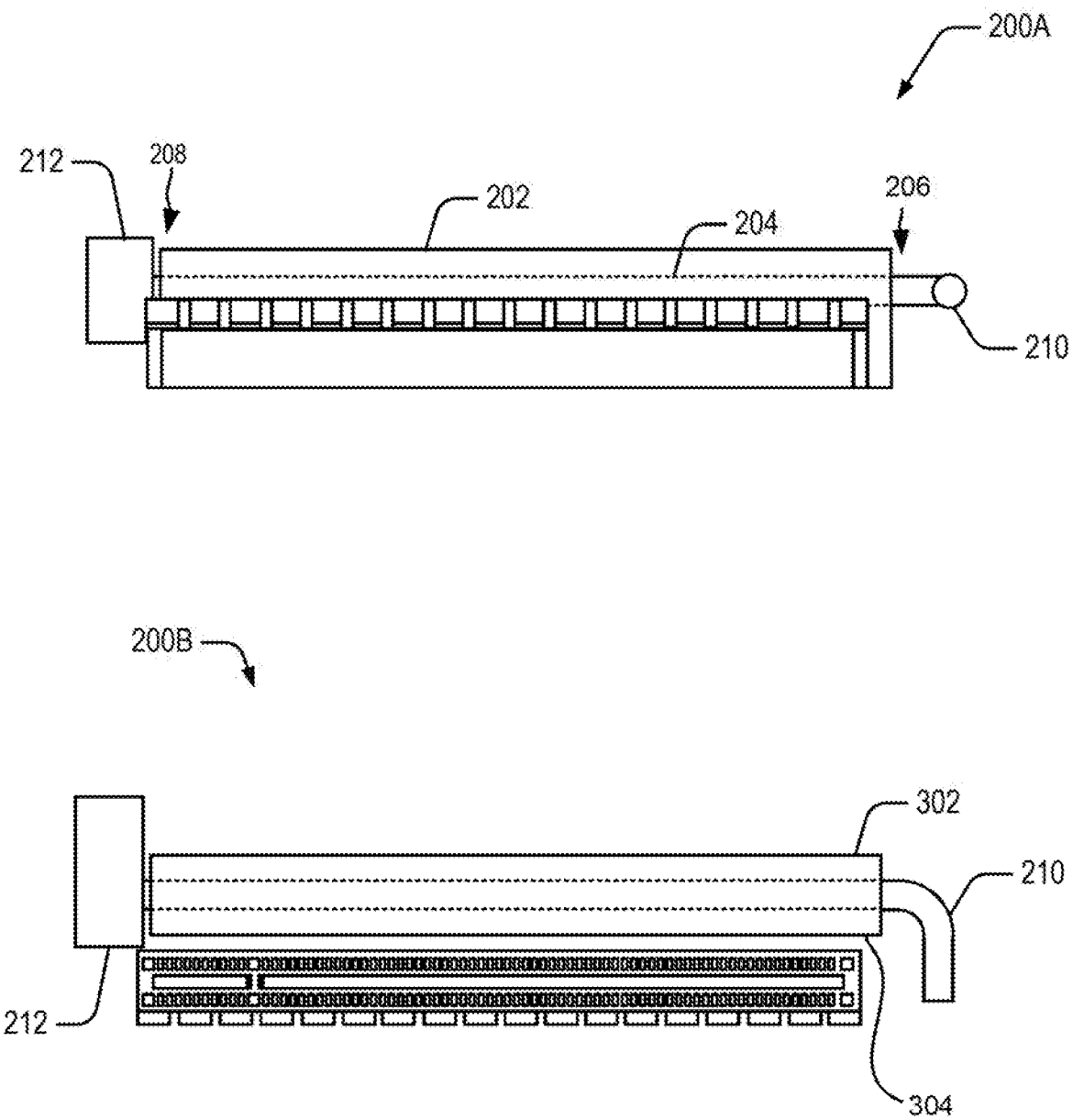

FIGS. 2-3 illustrate different views of a supporting assembly 200, as per an example. For example, FIG. 2 depicts a front perspective view of the supporting assembly 200, whereas FIG. 3 depicts the front view 200A and the top view 200B of the supporting assembly 200. The supporting assembly 200 includes a supporting member 202 and a latch bar 204. In an example, the latch bar 204, having a first end 206 and a second end 208, may extend through a channel within the supporting member 202. Although depicted having a certain shape, the supporting member 202 may be shaped in any other way without deviating from the scope of the present subject matter.

Similar to the supporting assembly 100, the latch bar 204 of the supporting assembly 200 includes a coupling arm 210 provided at the first end 206 of the latch bar 204. The second end 208 of the latch bar 204 is couplable with a control knob 212. In an example, the control knob 212 is rotatable about an axis. In an example, the control knob 212 may be radially offset from the rotational axis of the latch bar 204. The control knob 212 may further be provided with a protrusion 214 which allows the control knob 212 to be manually rotated between a first position and a second position. Rotation of the control knob 212 couples or decouples the control knob 212 with the latch bar 204.

The supporting member 202 along with the latch bar 204 may be positioned adjacent and parallel to an expansion slot 216. The expansion slot 216 may be any electrical connector which is adapted to receive and secure an installable component. The expansion slot 216 may further be coupled to an expansion bus or similar other electrically conducting media to provide electrical communication between the installable component and other components of the electronic device. Examples of such expansion slot 216 include, but are not limited to, Peripheral Component Interconnect (PCI) slot, Peripheral Component Interconnect Express (PCIe) slot, and an Accelerated Graphics Port (AGP) slot. The supporting member 202 may further include walled portions 302, 304 which may extend vertically from a base onto which the supporting assembly 200 and the expansion slot 216 may be installed.

As described, the rotation of the control knob 212 may be used to control the rotation of the latch bar 204. In such a case, the control knob 212, when in the second position, may lock and further restrict the rotation of the latch bar 204. On the other hand, the control knob 212 when in the first position, may allow a free rotation of the latch bar 204. The control knob 212 may therefore be rotated during the insertion or extraction of the installable component from the expansion slot 216.

Figure 4:
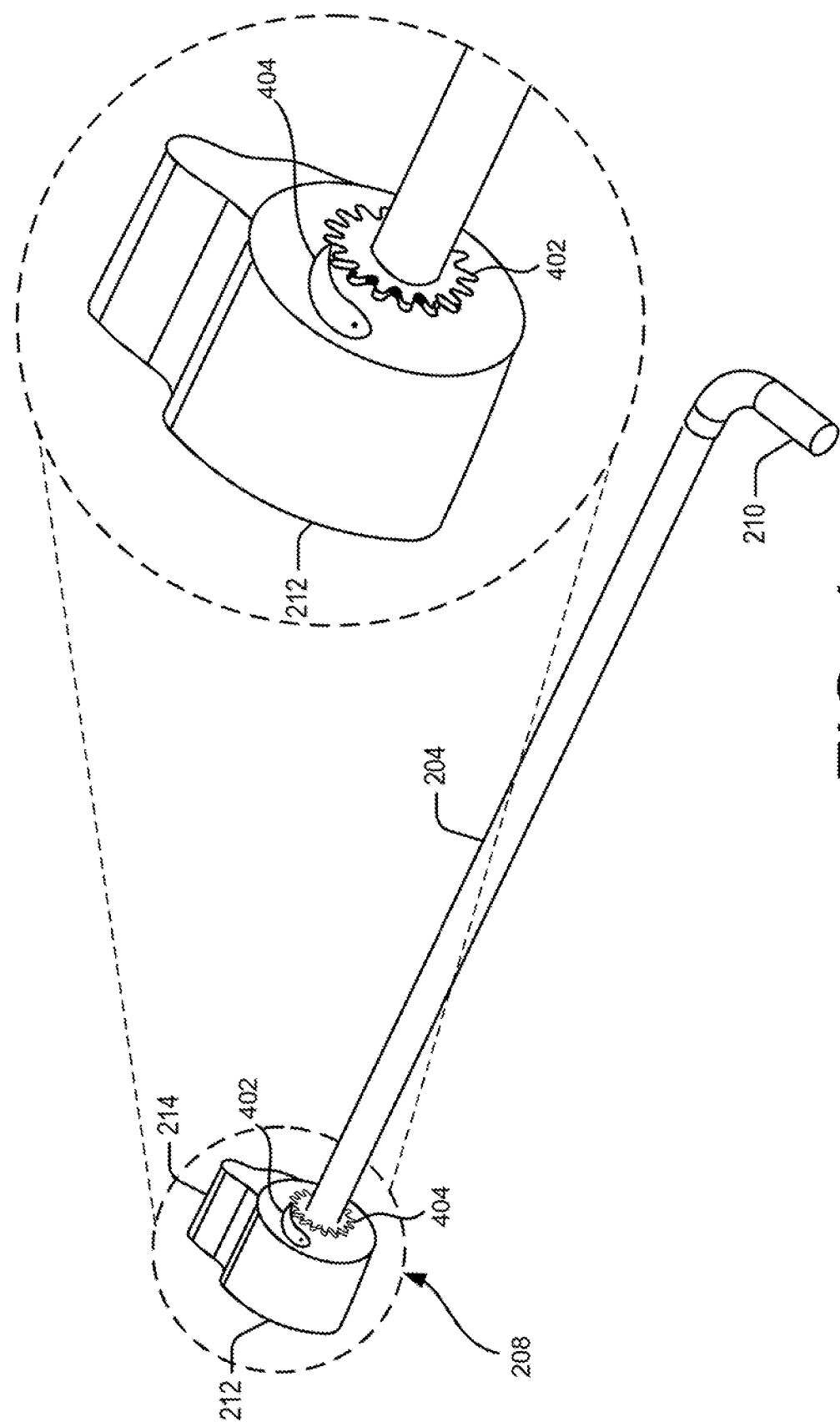
FIGS. 4-5 illustrate a perspective view of a latch bar of a supporting assembly, in accordance with an example of the present subject matter.

In an example, the control knob 212 and the second end 208 of the latch bar 204 may be provided with an adaptation which enable the latch bar 204 to engage and be locked by the control knob 212, when the control knob 212 is in the second position. An adaptation may be considered as a mechanical or a structural element, which causes the control knob 212 to engage with the latch bar 204. In operation, the adaptation on the control knob 212 may come into contact and engage with another complimentary adaptation provided on the latch bar 204. An example adaptation is illustrated in FIG. 4. As illustrated in FIG. 4, the control knob 212 is provided with a rigid pawl element 402, which may interact and engage with a series of teethed protrusions 404 radially situated at the second end 208 of the latch bar 204. When the control knob 212 is in the first position, the pawl element 402 may be separated from the teethed protrusions 404 thereby permitting the free rotation of the latch bar 204. In a similar manner, when the control knob 212 is in the second position, the pawl element 402 may engage with the teethed protrusions 404 provided on the latch bar 204. When engaged, the pawl element 402 may prevent any further rotation of the latch bar 204.

Figure 5:
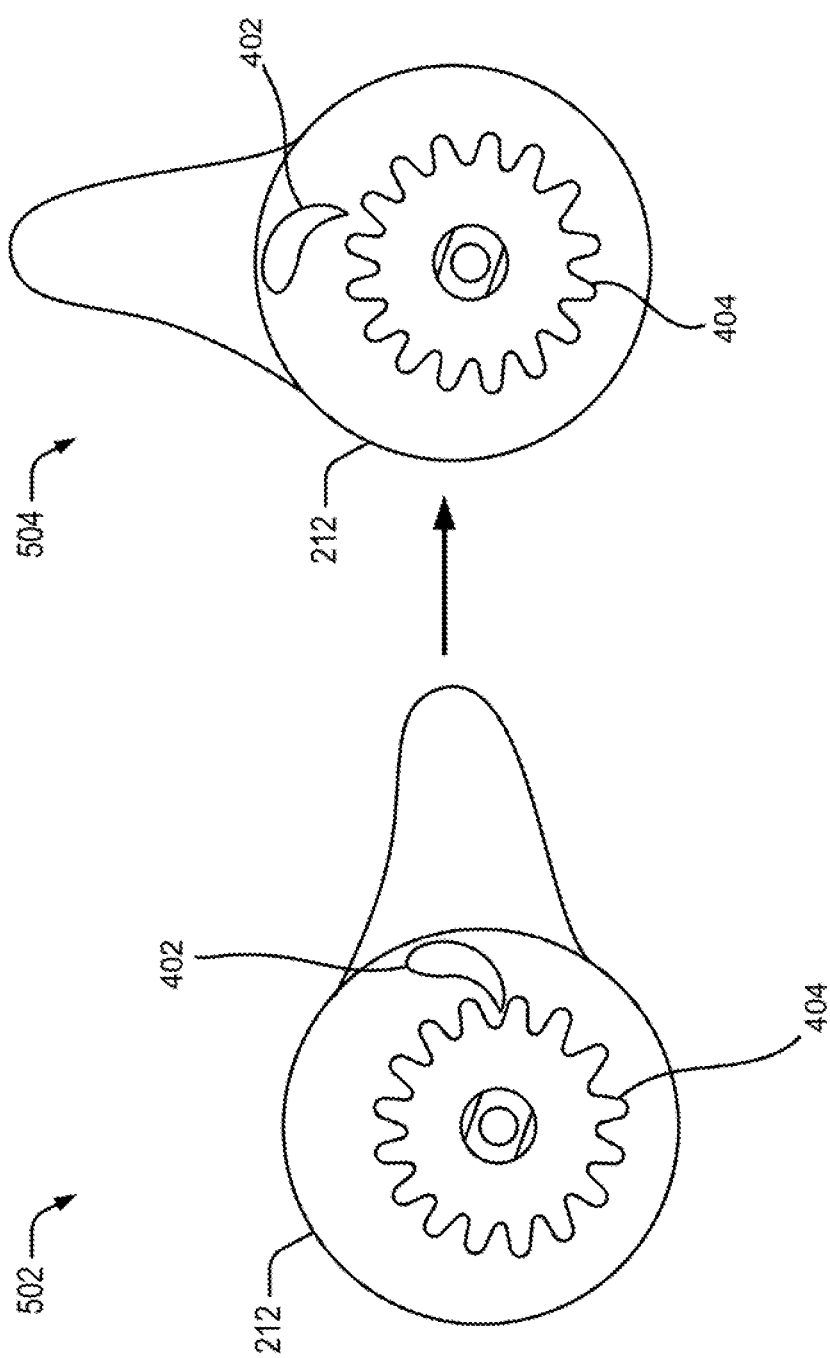

The manner in which the pawl element 402 engages with the teethed protrusions 404 is illustrated in FIG. 5. FIG. 5 depicts the position of the pawl element 402 with respect to the teethed protrusions 404 when the control knob 212 is a first position and in a second position. When the control knob 212 is the first position, the pawl element 402 (as may be seen in state 502) is away from the teethed protrusions 404. Since the pawl element 402 and the teethed protrusions 404 are not in contact, the latch bar 204 is rotatable about its own rotational axis. When the control knob 212 is rotated to the second position, the pawl element 402 moves closer towards the teethed protrusions 404 until the leading edge of the pawl element 402 is positioned in the troughs formed by the teethed protrusions 404. At this stage (as may be seen in state 504), the pawl element 402 is in an engaged position with the teethed protrusions 404. Since the teethed protrusions 404 are coupled to the latch bar 204, the engagement of the pawl element 402 and the teethed protrusions 404 rigidly secure the latch bar 204 and prevent its rotation.

The present example adaptations are only indicative. Other example adaptations may also be utilized. Such example adaptations will also fall within the scope of the present subject matter. In another example, the control knob 212 may be directly coupled to the latch bar 204. As a result, the rotation of the control knob 212 may cause a similar rotation of the latch bar 204, and a consequent movement of the coupling arm 210.

Figure 6:
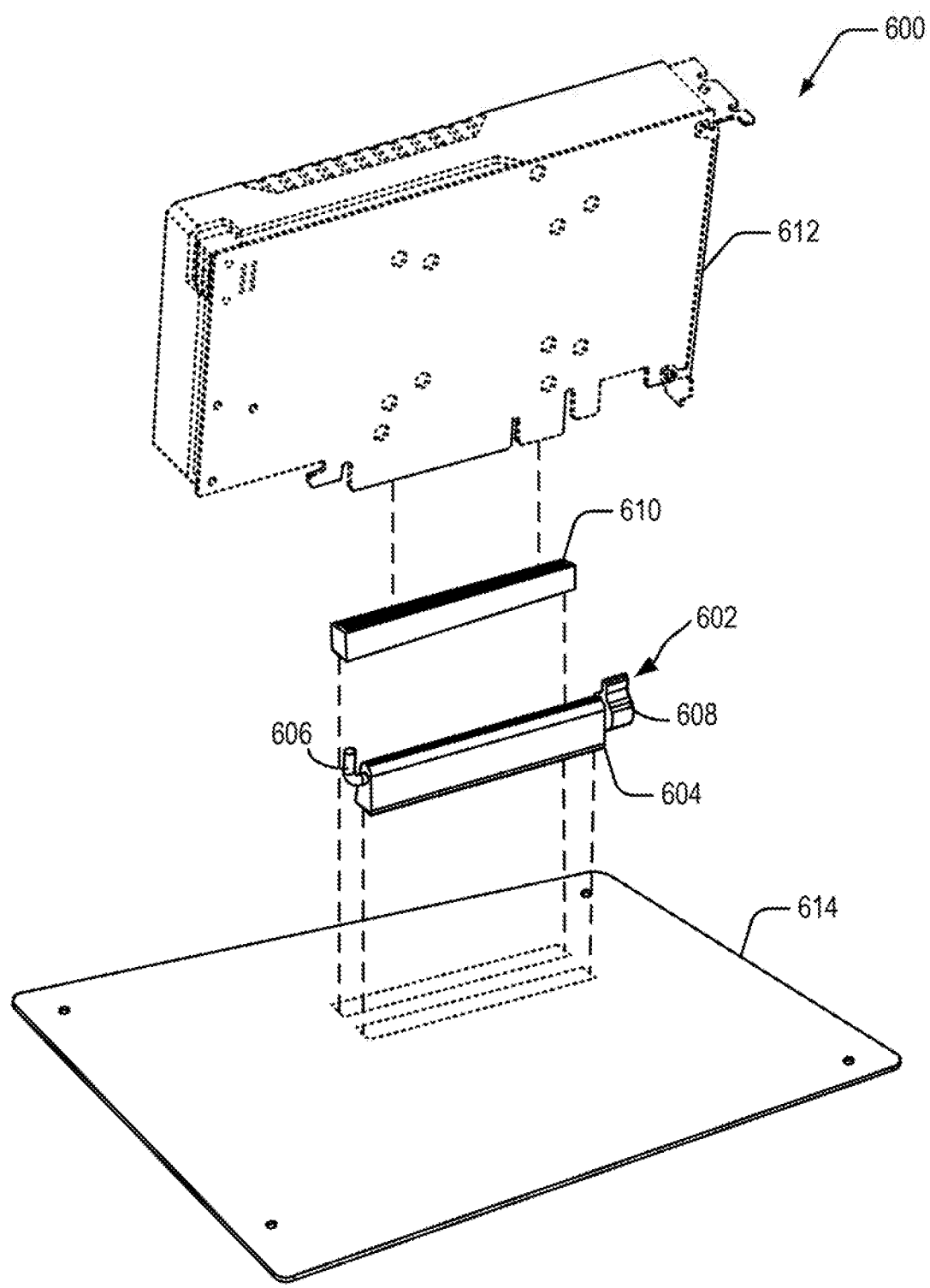
FIG. 6 illustrates an exploded-view depicting various components of an electronic circuit board assembly, in accordance with an example of the present subject matter.

FIG. 6 illustrates an exploded-view depicting various components of an electronic circuit board assembly 600, as per an example of the present subject matter. The electronic circuit board assembly 600 (referred to as the assembly 600) may further include a supporting assembly 602. The supporting assembly 602 may be similar to the supporting assembly 100 or supporting assembly 200, in shape and configuration. The supporting assembly 602 may further include a supporting member 604 within which a latch bar (not visible in FIG. 6) is present. The latch bar is further provided with coupling arm 606 at one end, and a rotatable control knob 608 at the other end.

The assembly 600 further includes a slot 610 which is to receive and hold an installable component 612. Examples of the installable component 612 include, but are not limited to, graphic cards, fiber channel adaptor cards, video processing cards, and storage cards. In an example, the supporting assembly 602 and the slot 610 may be further mounted on an electronic circuit board 614 (referred to as board 614). The board 614 may be present in a variety of electronic devices, such as a processor-based computing device. In the context of a computing device, the board 614 may be a motherboard.

As described previously, the functionalities of the electronic devices may be supplemented by installing the installable component 612. The installable component 612 (depicted in dotted lines) may be installed by pushing the installable component 612 into the slot 610. Once the installable component 612 is inserted into the slot 610, the control knob 608 may be rotated to secure the installable component 612 when it is inserted into the slot 610. For example, the control knob 608 may be moved to the second position, which restricts further rotation of the latch bar, and in turn also prevents any movement of the coupling arm 606. In another example, the control knob 608 may be rotated from the second position to a first position to allow the user to remove the installable component 612 from the slot 610. In such a case, the control knob 608 may no longer be coupled to the latch bar, thereby resulting in free rotation of the latch bar and the coupling arm 606. The manner in which the installable component 612 may be installed, secured, and subsequently removed, is described in conjunction with FIGS. 7-11.

Figure 9:
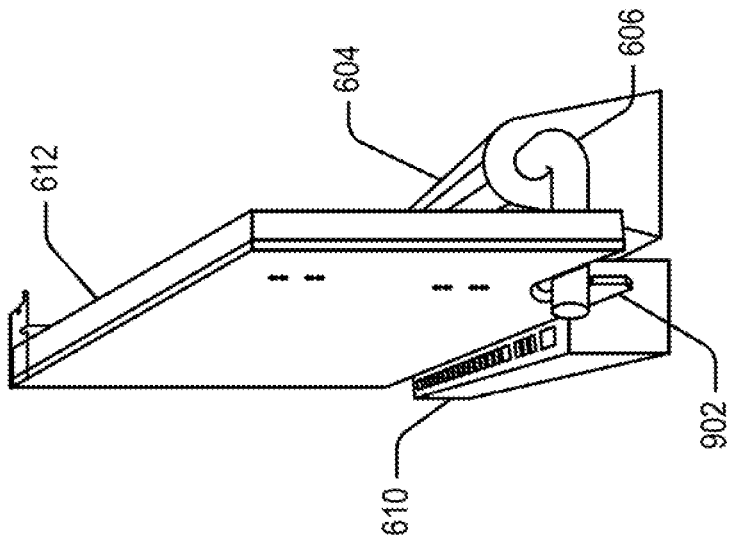
FIGS. 7-9 illustrate a supporting assembly through various stages of installing an installable component, in accordance with another example of the present subject matter.
Figure 8:
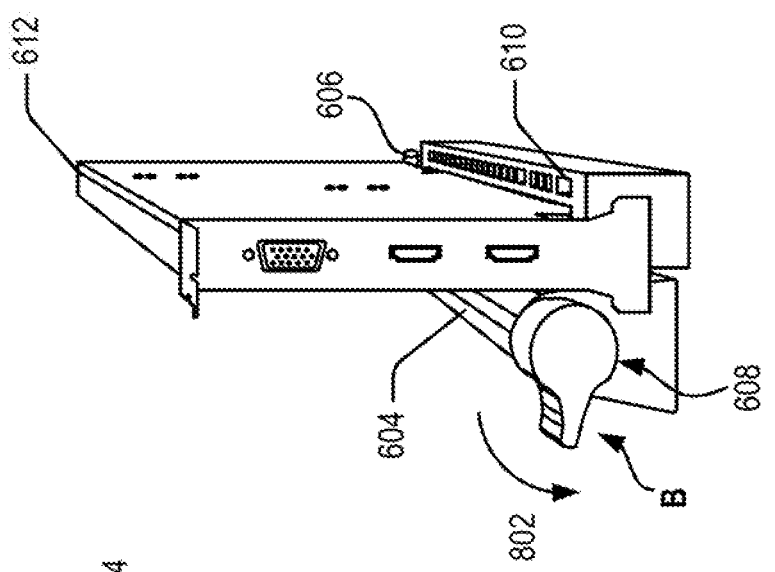
Figure 7:
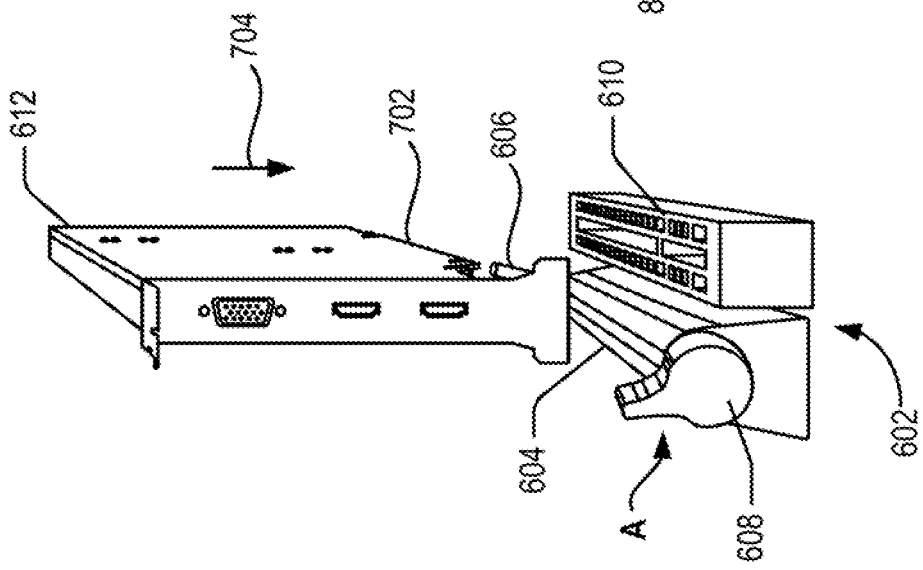

FIGS. 7-9 illustrate the example supporting assembly 602 depicting various stages of installation of the installable component 612 into the slot 610. In an example, the installable component 612 may be positioned such the insertable connections 702 of the installable component 612 are aligned with respect to the slot 610. Once aligned, a user may guide the installable component 612 in direction 704 (as indicated in FIG. 7), towards the slot 610. As the installable component 612 approaches the slot 610, the user may manually adjust the positioning of the installable component 612 until the insertable connections 702 are aligned with the slot 610. The installable component 612 may then be further pushed along the direction 704, until the insertable connections 702 are inserted into the slot 610 (as depicted in FIG. 8). While the installable component 612 is being inserted into the slot 610, the control knob 608 may be in a first position as indicated by 'A'. When in the first position 'A', the control knob 608 is disengaged from the latch bar. The latch bar, in such a case, is free to rotate about its rotational axis.

While being inserted, the coupling arm 606 may further engage with a latched portion 902 of the installable component 612 (depicted in FIG. 9). As the installable component 612 is moved closer to the slot 610, the coupling arm 606 while being in engagement with the latched portion 902, also moves downwards towards the base (e.g., the board 614) on which the supporting assembly 602 and the slot 610 are installed. While the installable component 612 is inserted into the slot 610, the control knob 608 may be rotated in the direction 802, and hence may move to a second position indicated by 'B' (as depicted in FIG. 8). The control knob 608, when in the second position, may lock the latch bar to prevent its further rotation. This in turn may further prevent the coupling arm 606 from rotating, thereby securing the installable component 612 when it is inserted into the slot 610.

Figure 11:
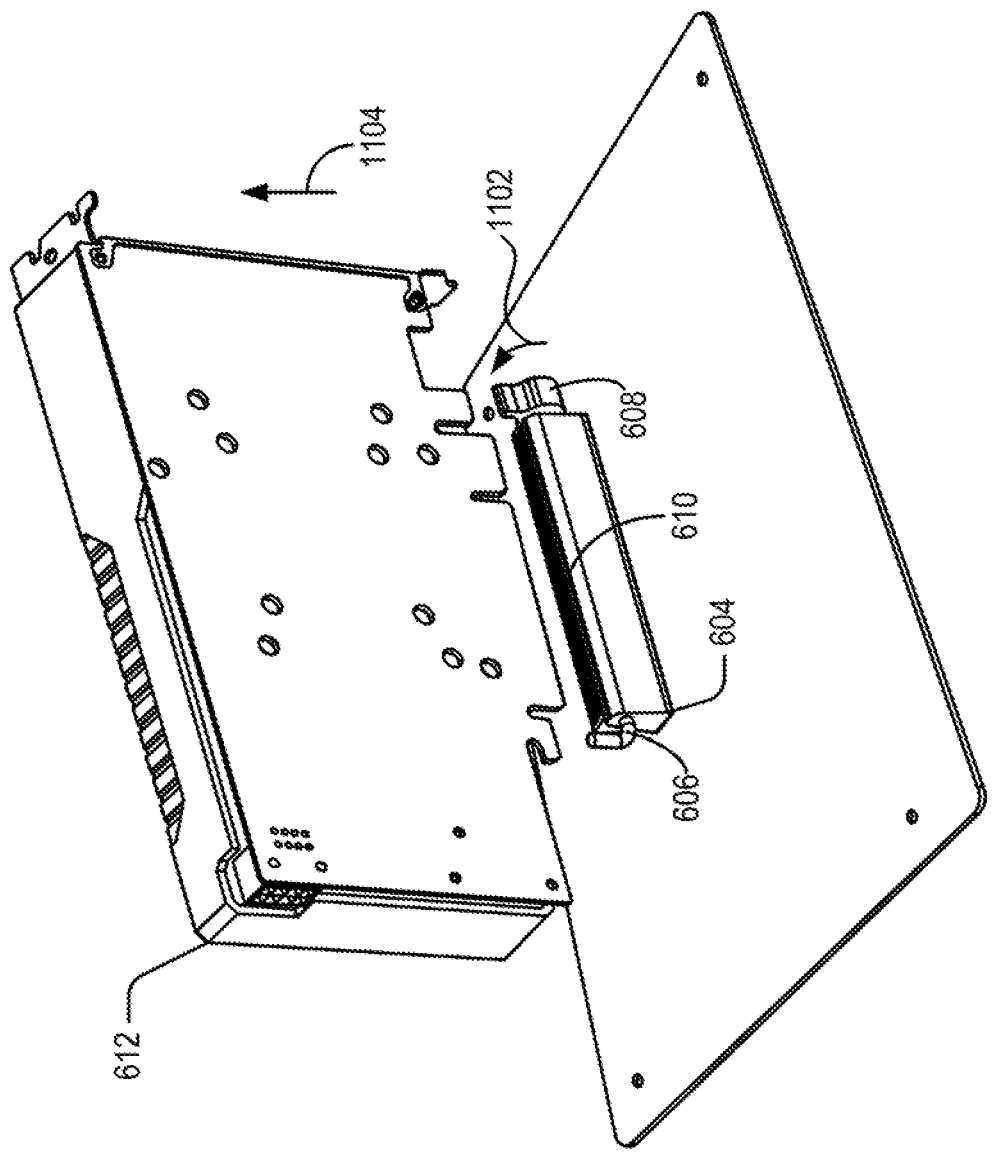

FIGS. 10-11 illustrate the supporting assembly 602 through various stages of removing the installable component 612 from the slot 610, as per an example. As depicted in FIG. 10, the installable component 612 is securely inserted into the slot 610. While the installable component 612 is secure within the slot 610, the coupling arm 606 remains engaged with the latched portion 902 of the installable component 612 (as depicted in FIG. 8). It may be noted that the control knob 608, when in the second position 'B', prevents any movement of the latch bar, which in turn, prevents the movement of the coupling arm 606. In certain cases, the user may have to remove the installable component 612 for a number of reasons. For example, the installable component 612, over a period of time, may develop faults. In certain other examples, the user may intend to enhance the functionalities of a computing device (in which the installable component 612 is installed), by upgrading the installable component 612 with another installable component having better specification. In either case, the installable component 612 may have to be manually removed from the slot 610 to allow the computing device to be fitted with another installable component.

As described previously, the control knob 608 controls the rotation of the latch bar. In an example, the control knob 608 may be rotated from the second position 'B' to the first position 'A' along direction 1102 (depicted in FIG. 11). As described previously, the rotation of the control knob 608 to the first position 'A' results in the control knob 608 being disengaged from the latch bar. Once the control knob 608 is disengaged, the latch bar is free to rotate, which in turn may further allow the coupling arm 606 to move. Since the coupling arm 606 (and the latch bar) is no longer constrained by the control knob 608, the installable component 612 may be withdrawn by manually pulling the installable component 612 in direction 1104 (as shown in FIG. 10).

As the installable component 612 is pulled away from the board 614, owing to the engagement between the coupling arm 606 and the latched portion 902, the coupling arm 606 also moves in an upward direction, away from the board 614. As the installable component 612 is pulled further away, the coupling arm 606 loses contact from the latched portion 902 (as shown in FIG. 10). At this stage, the control knob 608 is in the first position 'A', with the latch bar and the coupling arm 606 free to rotate. Subsequently, another installable component may be installed in a similar manner as discussed in conjunction with FIGS. 7-9, as per an example.

Figure 12:
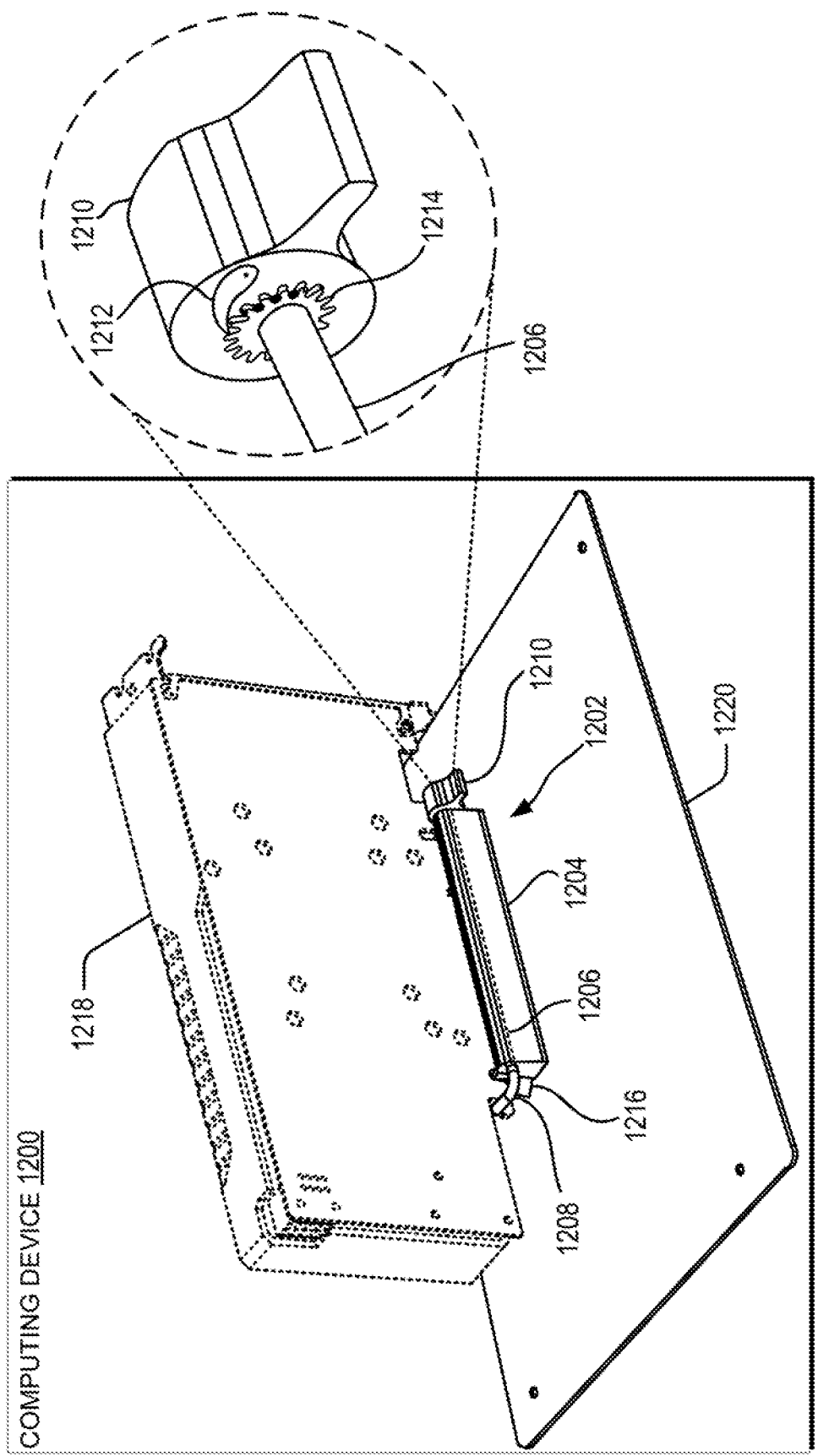
FIG. 12 illustrates a computing device with an example supporting assembly, in accordance with an example of the present subject matter.

FIG. 12 illustrates a computing device 1200, with a supporting assembly 1202. The supporting assembly 1202 may be similar to the supporting assembly 100, 200, or 602, in shape and configuration. The supporting assembly 1202 may further include a supporting member 1204 within which a latch bar 1206 (indicated in dotted lines) is present. The latch bar 1206 is further provided with coupling arm 1208 at one end. In an example, the other end of the latch bar 1206 is couplable to a rotatable control knob 1210 having an adaptation. An adaptation may be any structural or mechanical element that causes the control knob 1210 to engage with, and lock the latch bar 1206. In an example, the adaptation may include a pawl element 1212. In the present example, the pawl element may come into contact and engage with protrusions 1214 provided on the other end of the latch bar 1206. In operation, the control knob 1210 may cause the pawl element 1212 to either engage with, or disengage from, the protrusions 1214 provided on the latch bar 1206. When engaged, the control knob 1210 locks the latch bar 1206 to prevent any further rotation. When disengaged, the latch bar 1206 is also disengaged and is free to rotate about its rotational axis. The manner in which the pawl element 1212 engages with the protrusions 1214 is similar to the engagement between the pawl element 402 and the teethed protrusions 404 (as explained with respect to FIG. 5).

The assembly 1202 further includes an expansion slot 1216 (which is obstructed by the supporting member 1204) to receive and hold an installable component 1218. Examples of installable component 1218 include, but are not limited to, graphic cards, fiber channel adaptor cards, video processing cards, and storage cards. In an example, the coupling arm 1208 engage with a portion of the installable component 1218, when the installable component 1218 is inserted into the expansion slot 1216.

In an example, the supporting assembly 1202 and the expansion slot 1216 may be further mounted on an electronic circuit board 1220 (referred to as board 1220). The board 1220 may be present in a variety of electronic devices, such as a processor-based computing device. In the context of a computing device, the board 1220 may be a motherboard. As described previously, the functionalities of the electronic devices may be supplemented by installing the installable component 1218. The installable component 1218 (depicted in dotted line) may be installed by guiding the installable component 1218 into the chassis of the computing device 1100, and accommodated into the expansion slot 1216. Once the installable component 1218 is inserted into the expansion slot 1216, the control knob 1210 may be rotated to secure the installable component 1218 when it is inserted into the expansion slot 1216. In an example, the rotation of the control knob 1210 between a first position and a second position is to control rotation of the latch bar 1206 between a first position and a second position. When in the first position, the latch bar 1206 is rotatable to allow the installable component 1218 to be inserted into the expansion slot 1216. When in the second position, control knob 1210 secures the latch bar 1206, and in turn the coupling arm 1208, from rotating. bar 1206

Although implementations of present subject matter have been described in language specific to structural features and/or methods, it is to be noted that the present subject matter is not necessarily limited to the specific features or methods described. Rather, the specific features and methods are disclosed and explained in the context of a few implementations for the present subject matter.

We claim:

1. A supporting assembly comprising:
    a supporting member;
    a latch bar supportable by the supporting member, the latch bar comprising a first end and a second end, wherein the latch bar is to extend longitudinally along, and parallel to, a slot for an installable component of a computing device;
    a coupling arm provided at the first end of the latch bar, wherein the coupling arm is to engage with a portion of the installable component, in response to the installable component being inserted into the slot; and
    a control knob couplable with the second end of the latch bar, wherein the control knob is rotatable, and is to control rotation of the latch bar.

2. The supporting assembly as claimed in claim 1, wherein the control knob is moveable between a first position and a second position, and wherein the control knob, when moving to the first position from the second position, is to enable the coupling arm to move away from a base of the supporting member, to enable extraction of the installable component from the slot.

3. The supporting assembly as claimed in claim 2, wherein, on the installable component being inserted into the slot, the control knob, when in the second position, is to restrict the movement of the coupling arm being in engagement with the portion of the installable component.

4. The supporting assembly as claimed in claim 1, wherein the supporting member is a longitudinally extending member enclosing a portion of the latch bar.

5. The supporting assembly as claimed in claim 1, wherein the coupling arm extends radially from the first end of the latch bar.

6. The supporting assembly as claimed in claim 1, wherein a rotational axis of the control knob extends along the rotational axis of the latch bar and is radially offset from the rotational axis of the latch bar.

7. An electronic circuit board assembly comprising:
    an expansion slot, wherein the expansion slot is to receive an installable component;
    a latch bar supported by a supporting member, the latch bar comprising a first end and a second end, wherein the latch bar is adjacent to and extends longitudinally along the expansion slot;
    a coupling arm provided at the first end of the latch bar, wherein the coupling arm is to engage with a portion of the installable component in response to the installable component being inserted into the expansion slot; and
    a control knob couplable with the second end of the latch bar, wherein the control knob is rotatable and is to engage with, and control rotation of, the latch bar to permit insertion and extraction of the installable component from the expansion slot.

8. The electronic circuit board as claimed in claim 7, wherein the expansion slot is one of a Peripheral Component Interconnect (PCI) slot, a Peripheral Component Interconnect Express (PCIe) slot, and an Accelerated Graphics Port (AGP) slot.

9. The electronic circuit board as claimed in claim 7, wherein the control knob is to rotate between a first position and a second position, wherein the control knob, when in the first position, is to allow the coupling arm to rotate to enable extraction of the installable component from the expansion slot.

10. The electronic circuit board as claimed in claim 9, wherein, when moved to the second position, the control knob is to restrict the movement of the coupling arm, when the coupling arm is in engagement with the portion of the installable component.

11. The electronic circuit board as claimed in claim 7, wherein the coupling arm extends orthogonally from the latch bar.

12. A computing device comprising:

an electronic circuit board;

an expansion slot integrated onto the electronic circuit board, wherein the expansion slot is to receive an installable component;

a latch bar longitudinally extending along the expansion slot, the latch bar comprising a first end and a second end, with the latch bar being supported by a supporting member adjacent to the expansion slot;

a coupling arm extending from the first end of the latch bar, wherein the coupling arm is to engage with a portion of the installable component, in response to the installable component being inserted into the expansion slot; and a control knob couplable with the second end of the latch bar, wherein the control knob is rotatable between a first position and a second position and comprises an adaptation to engage with and control rotation of the latch bar to permit insertion and extraction of the installable component from the expansion slot.

13. The computing device as claimed in claim 12, wherein the control knob is to:

permit rotation of the latch bar to enable extraction of the installable component from the expansion slot when the control knob is in the first position; and prevent rotation of the latch bar and to secure the installable component into the expansion slot when the control knob is in the second position.

14. The computing device as claimed in claim 12, wherein the adaptation comprises a pawl element, wherein the pawl element is coupled to the control knob.

15. The computing device as claimed in claim 14, wherein the latch bar comprises protrusions provided radially at the second end of the latch bar, wherein the protrusions are to engage with the pawl element when the control knob is in the second position.

* * * * *